(12) United States Patent
Usui

(10) Patent No.: US 12,160,245 B2
(45) Date of Patent: Dec. 3, 2024

(54) AD CONVERTER AND SEMICONDUCTOR DEVICE INCLUDING THE SAME

(71) Applicant: RENESAS ELECTRONICS CORPORATION, Tokyo (JP)

(72) Inventor: Masaaki Usui, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 897 days.

(21) Appl. No.: 17/188,247

(22) Filed: Mar. 1, 2021

(65) Prior Publication Data

US 2022/0278692 A1 Sep. 1, 2022

(51) Int. Cl.
H03M 1/12 (2006.01)
G06F 11/07 (2006.01)
H03M 1/10 (2006.01)

(52) U.S. Cl.
CPC ....... *H03M 1/1245* (2013.01); *G06F 11/0745* (2013.01); *G06F 11/0781* (2013.01); *H03M 1/10* (2013.01); *H03M 1/1205* (2013.01); *H03M 1/125* (2013.01)

(58) Field of Classification Search
CPC .... H03M 1/1245; H03M 1/10; H03M 1/1205; H03M 1/125
USPC ........................................................ 702/104
See application file for complete search history.

(56) References Cited

U.S. PATENT DOCUMENTS

| | | |
|---|---|---|
| 5,736,948 A | 4/1998 | Mitsuishi et al. |
| 7,830,286 B2 | 11/2010 | Kabune et al. |
| 10,771,079 B2 | 9/2020 | Kokusho |
| 2010/0283644 A1 | 11/2010 | Katsuki et al. |
| 2020/0186159 A1* | 6/2020 | Kokusho ............. H03M 1/1004 |

FOREIGN PATENT DOCUMENTS

| | | |
|---|---|---|
| JP | 08-265155 A | 10/1996 |
| JP | 2009-284302 A | 12/2009 |

OTHER PUBLICATIONS

Extended European Search Report issued in corresponding European Patent Application No. 22157872.7-1205, dated Jul. 5, 2022.

* cited by examiner

*Primary Examiner* — Michael P Nghiem
(74) *Attorney, Agent, or Firm* — Rimon P.C.

(57) ABSTRACT

An AD converter includes a plurality of analog input terminals, a reference signal generation circuit that generates an analog reference signal, a sample-and-hold unit that includes a plurality of sample-and-hold circuits sampling the analog reference signal or one of analog input signals from the analog input terminals, a control unit that controls the sample-and-hold unit, and a conversion unit that converts an output signal from the sample-and-hold unit into a digital signal. The control unit controls the sample-and-hold unit to perform the output operation for analog input signal and the sampling operation for the analog reference signal.

7 Claims, 12 Drawing Sheets

AD CONVERTER AND SEMICONDUCTOR DEVICE INCLUDING THE SAME

BACKGROUND

The present invention relates to a semiconductor device, and for example, the present invention can be suitably applied to a semiconductor device having an analog-to-digital converter (AD converter).

In recent years, in the automobile market, development of a system that complies with functional safety standards has been demanded. Therefore, in the in-vehicle system, it is required to convert analog signals from many mounted external sensors into digital signals in order to support functional safety. Therefore, in an in-vehicle system, a microcomputer incorporating an AD converter is used. The microcomputer includes a plurality of analog input terminals to handle a plurality of analog signals. If the microcomputer incorporates a plurality of AD converters in accordance with the number of analog input terminals, the size of the microcomputer increases. Therefore, a microcomputer provided with a single AD converter, which selects sequentially analog signals input to a plurality of analog input terminals, samples and converts them to digital signals, is disclosed in Japanese Unexamined Patent Application Publication No. 2009-284302 (Patent Document 1).

In addition to, the functional safety is required for a microcomputer used in an in-vehicle system. Patent Document 1 discloses a microcomputer that periodically selects an analog reference voltage generated by a self-diagnosis voltage generator and performs A/D conversion to the analog reference voltage. More specifically, the multiplexer for selecting one analog input signal to be performed A/D conversion periodically selects the analog reference voltage. The A/D conversion result of the periodically selected analog reference voltage is held in the reference voltage conversion result holding register. The CPU (Central Processor Unit) periodically reads the data held in the reference voltage conversion result holding register, and determines whether or not the analog reference voltage has been analog-to digital converted correctly in order to detect the conversion abnormality of the AD converter or a failure of the AD converter. In Patent Document 1, self-diagnosis of the AD converter is performed in this manner.

Japanese Unexamined Patent Application Publication No. 8-265155 (Patent Document 2) discloses a semiconductor device including a plurality of sample-and-hold circuits in order to increase the speed of the A/D converting operation.

SUMMARY

For example, the motor drive control system is one of the in-vehicle systems. The motor drive control system constantly monitors signals from external sensors and feeds back to motor control after the start of an automobile engine. In the motor drive control system, in order to improve the accuracy of the drive control, it is desirable to acquire an analog input signal at a predetermined timing from an external sensor and feed the A/D conversion result of the analog input signal.

However, as in Patent Document 1, when the conversion operation of the analog reference voltage is performed periodically, the A/D conversion operation of the analog signal from the external sensor cannot be performed during the conversion operation period of the analog reference voltage. That is, the execution of the self-diagnosis, since the A/D conversion operation of the analog signal from the external sensor is interrupted, there is a possibility that the accuracy of the drive control is reduced. Alternatively, to avoid loss of accuracy, the timing of self-diagnosis using the analog reference voltage may be limited. However, it is not preferable to limit the execution timing of the self-diagnosis from the viewpoint of functional safety.

Other objects and novel features will become apparent from the description of this specification and the accompanying drawings.

An AD converter according to an aspect of the present invention includes a plurality of analog input terminals, a reference signal generating circuit that generates an analog reference signal, a sample-and-hold unit that includes a plurality of sample-and-hold circuits, a control unit that controls the sample-and-hold unit, and a conversion unit that converts a output signal from the sample-and-hold unit into a digital signal. Each of the sample-and-hold circuits samples the analog reference signal or one of the analog input signals input to the analog input terminals. The control unit controls the sample-and-hold unit to perform the output operation for the analog input signal and the sampling operation for the analog reference signal in parallel.

According to the one embodiment, it is possible to perform the AD conversion of the analog reference voltage for self-diagnosis without interrupting the AD conversion operation of the analog signal supplied from the outside.

DETAILED DESCRIPTION

Figure 1:
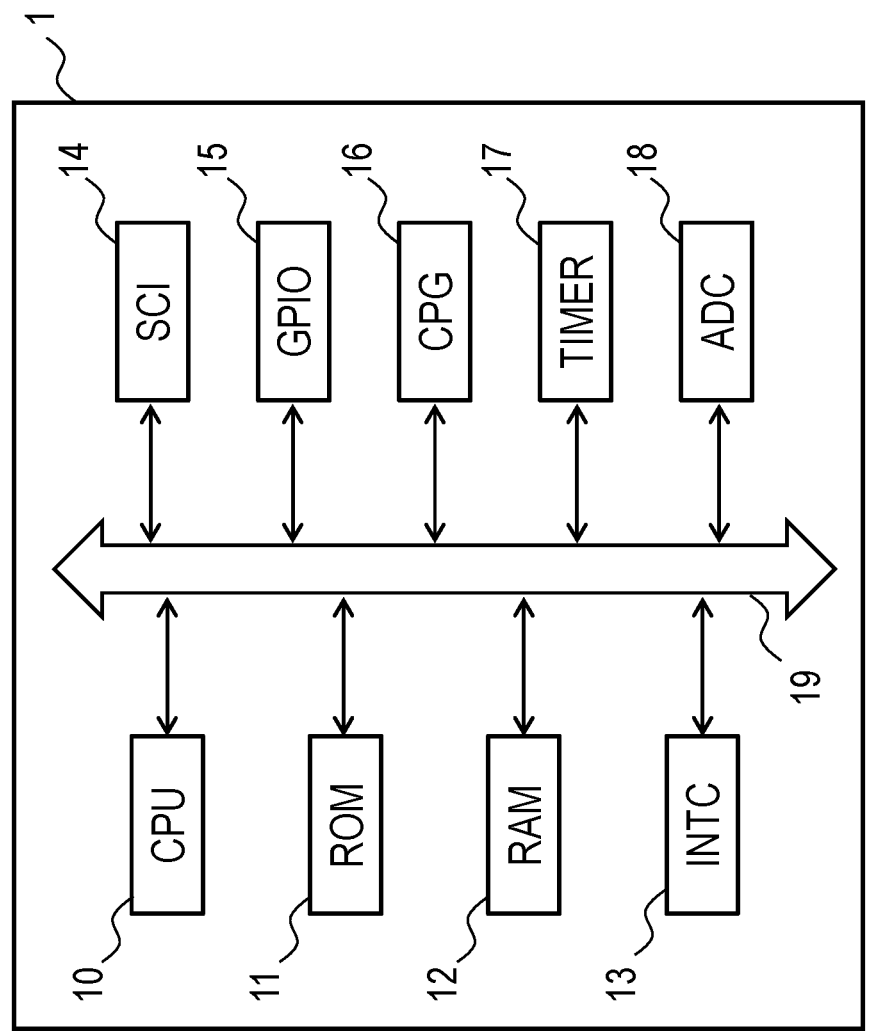
FIG. 1 is a block diagram illustrating an exemplary configuration of semiconductor device according to first embodiment.

Hereinafter, a semiconductor device according to an embodiment will be described in detail by referring to the drawings. In the specification and the drawings, the same or corresponding form elements are denoted by the same reference numerals, and a repetitive description thereof is omitted. In the drawings, for convenience of description, the calibration may be omitted or simplified. Also, at least some of the embodiments may be arbitrarily combined with each other.

First Embodiment (Configuration of MCU)

FIG. 1 is a block diagram illustrating an exemplary configuration of semiconductor device according to the present embodiment. FIG. 1 shows the configuration of a Micro controller unit (MCU) 1 as an exemplary semiconductor device.

The MCU 1 shown in FIG. 1 is formed on a semiconductor substrate, such as single-crystal silicon, by known semiconductor integrated-circuit fabrication techniques, although not particularly limited. The MCU 1 includes, but are not limited to, CPU 10, ROM (Read Only Memory) 11, RAM (Random Access Memory) 12, an interrupt controller (INTC) 13, a serial communication interface (SCI) 14, a general purpose Interface (GPIO) 15, a clock oscillator (CPG) 16, a timer 17, an AD converter (ADC) 18, and the like. The functional blocks or functional modules are interconnected through an internal bus 19.

The ROM 11 stores a program that runs on the CPU 10. The ROM is, for example, a flash memory. The CPU 10 performs predetermined arithmetic processing by executing a program stored in ROM 11. The RAM 12 temporarily stores the data of the arithmetic operation in the CPU 10. The interrupt controller 13 performs interrupt control on the CPU 10 based on an interrupt request from the peripheral circuit. The serial communication interface 14 is used for serial communication between the MCU 1 and peripheral devices. The general-purpose interface 15 includes general-purpose terminals for the MCU 1 to exchange digital signals with the outside. The clock oscillator 16, for example, is connected to the crystal resonator via an external terminal (not shown) to generate a clock signal of a predetermined frequency. The MCU 1 operates in synchronization with the clock signal generated by the clock oscillator 16. The timer 17 generates various timer pulses. The AD converter 18 converts the analog input signal transferred through the analog input terminal into a digital signal.

(Configuration of AD Converter)

Figure 2:
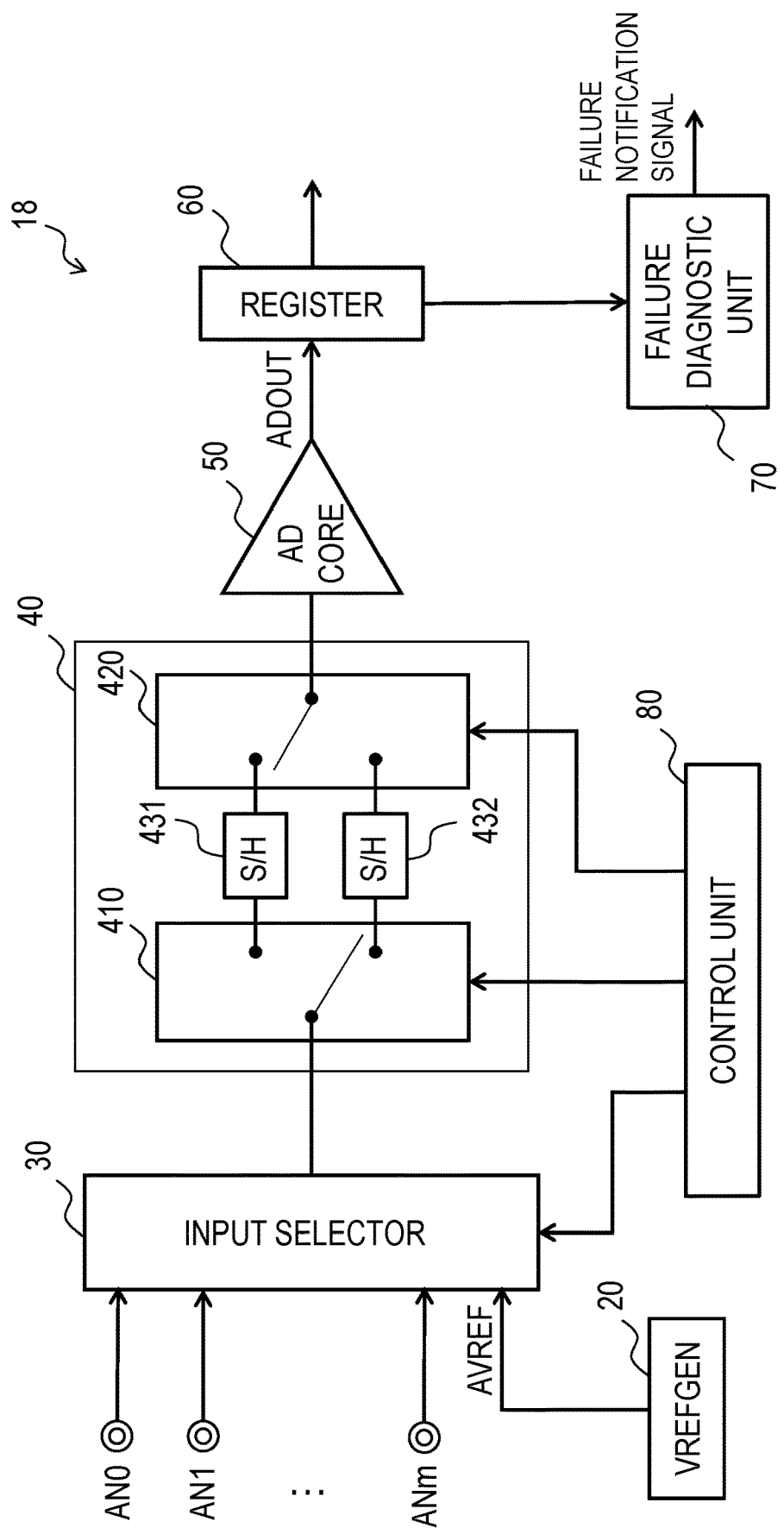
FIG. 2 is a block diagram showing an exemplary configuration of an AD converter according to first embodiment.

FIG. 2 shows a configuration example of the AD converter 18.

The AD converter 18 includes a reference signal generation circuit (VREFGEN) 20, a input selector 30, a sample-and-hold unit 40, the A/D conversion unit (AD core) 50, a register 60, a failure diagnostic unit 70 and a control unit 80.

The reference signal generation circuit 20 generates an analog reference signal AVREF for self-diagnosis. The reference signal generation circuit 20, although not particularly limited, generates an analog high potential side power supply voltage AVCC, ½ AVCC and the analog low potential side power supply voltage AVSS. Then, the reference signal generation circuit 20 outputs any one of the analog high potential side power supply voltage AVCC, ½AVCC and the analog system low potential side power supply voltage AVSS as analog reference voltage AVREF.

The analog input terminals AN0-ANm are each supplied with an analog signal from an external sensor. The analog input terminals AN0-ANm are also referred to as input channels 0 to m. The input selector 30 selects and outputs one of the analog input signals A0 to Am corresponding to the input channels 0-$m$ and the analog reference voltage AVREF. The input selector 30 is, for example, a multiplexer.

The sample-and-hold unit 40 samples and holds the analog signal selected and output by the input selector 30. The sample-and-hold unit 40 includes a first selection unit 410, a second selection unit 420, and sample-and-hold circuits 431 and 432 (also referred to as first and second sample-and-hold circuits). The first selection unit 410 selects one of the sample-and-hold circuits 431 and 432, and connects the selected sample-and-hold circuit and the input selector 30. That is, the analog signal output from the input selector 30 is supplied to the sample-and-hold circuit selected by the first selection unit 410. The second selection unit 420 selects one of the sample-and-hold circuits 431 and 432, and connects the selected sample-and-hold circuit and the A/D conversion unit 50. That is, the analog signal held in the sample-and-hold circuit selected by the second selection unit 420 is output to the A/D conversion unit 50. With such a configuration, the sampling operation by one of the sample-and-hold circuits is performed in parallel with the output operation to the conversion unit by the other sample-and-hold circuits.

The A/D conversion unit 50 executes A/D conversion operation of the input analog signal. That is, the A/D conversion unit 50 converts the analog signal output from the sample-and-hold unit 40 into a digital signal. The A/D conversion unit 50 is, for example, a successive approximation type A/D conversion circuit. The conversion result by the A/D conversion unit 50 is stored in the conversion result holding register 60.

The conversion result holding register 60 includes a plurality of registers (not shown) corresponding to the analog input terminals AN0 to ANm, that is, the input channels 0-$m$. The conversion results of the analog input signals input from the analog input terminals AN0-ANm are respectively stored in the corresponding registers for each input channels. The conversion result stored in the conversion result holding register 60 is read out by the CPU 10 or the like through the internal bus 19, and a predetermined calculation process is performed by the CPU 10. Further, the conversion result holding register 60 includes a reference signal conversion result register for storing the conversion result of the analog reference signal (not shown).

The failure diagnostic unit 70 reads the conversion result of the analog reference signal stored in the reference signal conversion result register in the conversion result holding register 60, and compares the conversion result with the expected value. When the conversion result of the analog reference signal is different from the expected value, the failure diagnostic unit 70 determines that an anomaly or failure has occurred in the AD converter 18 and outputs a failure notification signal. The failure notification signal may be supplied to the interrupt controller 13 as an interrupt processing request signal. The CPU 10 may receive an interrupt signal based on the failure notification signal from the interrupt controller 13, and start an appropriate interrupt process for functional safety based on the interrupt signal.

The control unit 80 controls the input selector 30 and the sample-and-hold unit 40. Specifically, the controller unit 80 controls the selection of the analog input signals A0-Am corresponding to the input channels 0 to m and the analog reference signal AVREF by the input selector 30. Furthermore, the control unit 80 controls the selection of the sample-and-hold circuits by the first selection unit 410, and the selection of the sample-and-hold circuits by the second selection unit 420. The control unit 80 may be coupled to the CPU 10 via a bus (not shown) to transmit and receive various control signals.

Figure 3:
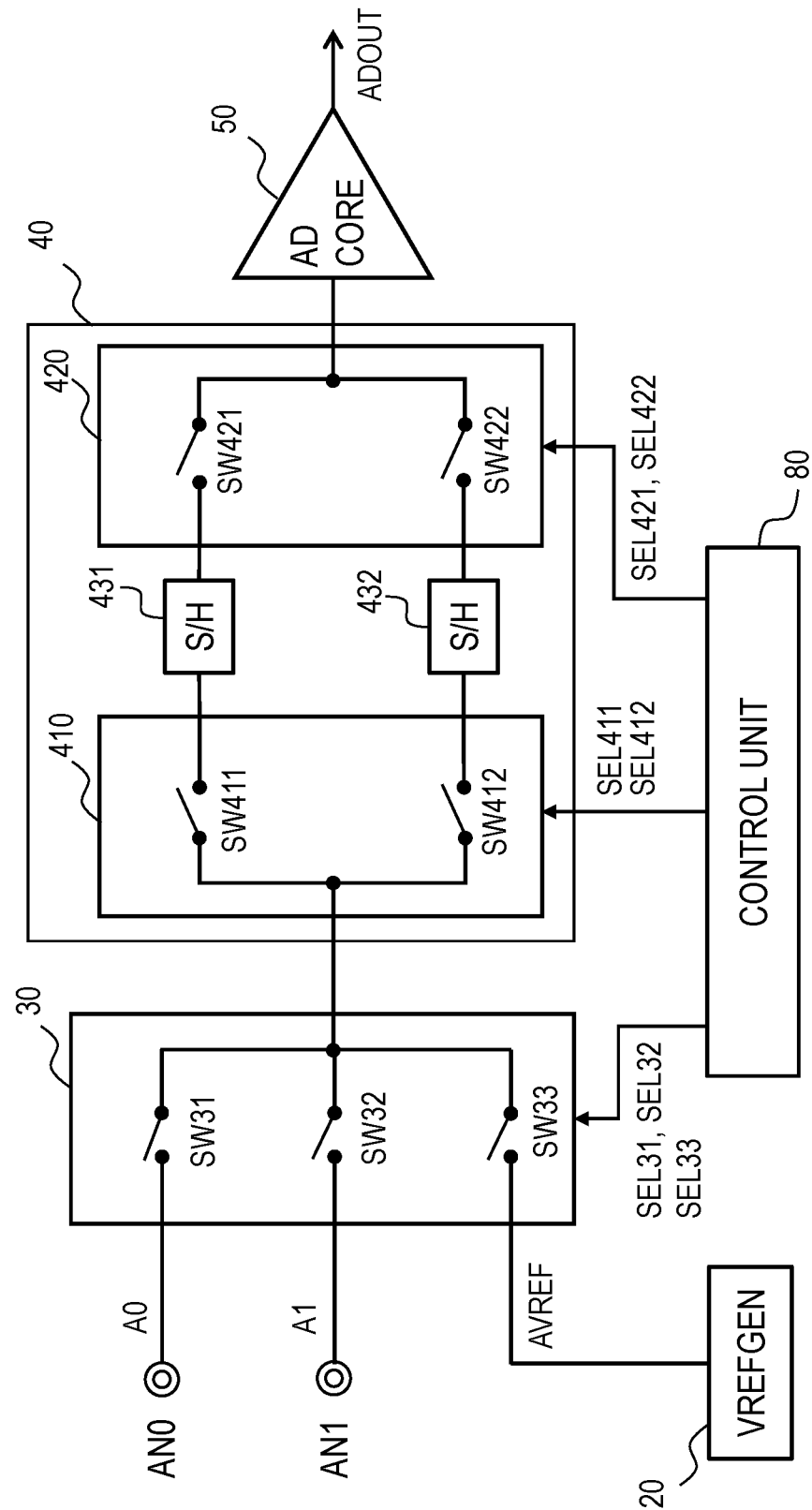
FIG. 3 is a block diagram showing an exemplary configuration of an AD converter according to first embodiment.

Next, a configuration example of the input selector 30, the first selection unit 410, and the second selection unit 420 will be described with reference to FIG. 3. Here, the AD converter 18 is assumed to perform A/D conversion operation of the analog input signals supplied to the analog input terminals AN0 and AN1, respectively. Hereinafter, the analog input signal supplied to the analog input terminal AN0 is referred to as the analog input signal A0 of input channel 0, and the analog input signal supplied to the analog input terminal AN1 is referred to as the analog input signal A1 of input channel 1.

The input selector 30 has switches SW31, SW32 and SW33. The switches SW31, SW32 and SW33 are connected to the analog input terminals AN0 and AN1 and the reference signal generation circuit 20, respectively. The switches SW31, SW32 and SW33 are turned on or off by the selection signal SEL31, SEL32 and SEL33 output from the control unit 80, respectively. Thus, the input selector 30 selects any one of the analog input signal A0 of the input channel 0, the analog input signal A1 of the input channel 1 and the analog reference signal AVREF, and outputs it to the sample-and-hold unit 40. Further, the input control unit 30 is controlled by the control unit 80 so as to connect the reference signal generation circuit 20 and the sample-and-hold unit 40 in order to be sampled the analog reference signal AVREF after sampling of the analog input signal corresponding to the analog input terminal selected just before is complete.

The first selection unit 410 has switches SW411 and SW412 corresponding to the first and second sample-and-hold circuits 431 and 432. The switch SW411 is provided between the input selector 30 and the sample-and-hold circuit 431, the switch SW412 is provided between the input selector 30 and the sample-and-hold circuit 432. The switches SW411 and SW412 are turned on or off based on the selection signal SEL411 and SEL412 output from the control unit 80. Thus, the first selection unit 410 selects one of the sample-and-hold circuits for sampling and holding the analog signal output from the input selector 30.

The second selection unit 420 as well as the first selection unit 410 includes switches SW421 and SW422 corresponding to the first and second sample-and-hold circuits 431 and 432. The switch SW421 is provided between the sample-and-hold circuit 431 and the A/D conversion unit 50, the switch SW422 is provided between the sample-and-hold circuit 432 and the A/D conversion unit 50. The switches SW421 and SW422 are turned on or off based on the selection signals SEL421 and SEL422 output from the control unit 80. Thus, the second selection unit 420 selects one of the sample-and-hold circuits 431 and 432, and outputs the analog signal held in the selected sample-and-hold circuit to the A/D conversion unit 50.

(Operation of the AD Converter Related to First Embodiment)

Figure 4:
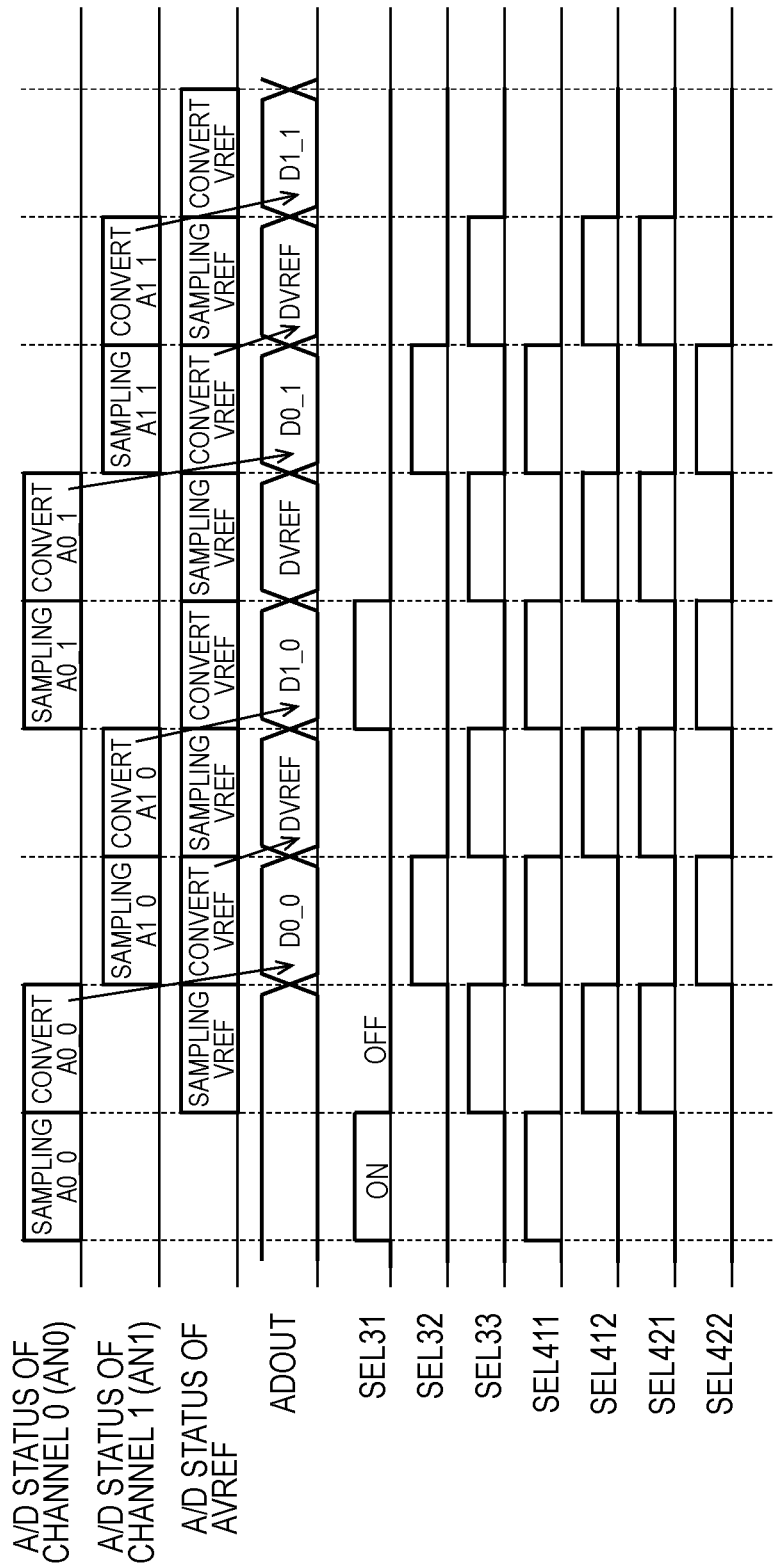
FIG. 4 is a timing chart for explaining the operation of the AD converter according to first embodiment.

Referring to FIG. 4, the operation of the AD converter 18 shown in FIG. 3 will be described. The A/D conversion operation of the AD converter 18 includes a sampling operation for charging the charge based on the analog signal, and a conversion operation for converting the sampled analog signal into a digital signal. The number of input channels of the AD converter 18 shown in FIG. 3 is two. However, regardless of the number of input channels, A/D conversion operation of the analog input signal of the input channel may be performed sequentially.

First, in FIG. 4, the input channel 0 (CHANNEL 0) is selected based on the selection signal SEL31. The analog input signal A0_0 of the selected input channel 0 is supplied to the sample-and-hold circuit 431 selected based on the selection signal SEL411 and sampled and held (SAMPLING A0_0). When the sampling operation of the analog input signal A0_0 is completed, the selection signal SEL421 is activated. Then, the analog input signal A0_0 held in the sample-and-hold circuit 431 is output to the A/D conversion unit 50. The A/D conversion unit 50 converts the analog input signal A0_0 into a digital signal (CONVERT A0_0) and outputs an A/D conversion result D0_0.

The selection signal SEL33 and the selection signal SEL412 are activated in parallel with the conversion operation (CONVERT A0_0) of the analog input signal A0_0 described above. That is, the analog reference signal AVREF is supplied to the sample-and-hold circuit 432 following input channel 0 and sampled and held (SAMPLING VREF). In other words, the sampling operation of the analog reference signal AVREF is performed during the period in which the analog input signal A0_0 of the input channel 0 selected prior to the analog reference signal AVERF is converted into a digital signal by the A/D conversion unit 50. When the sampling operation of the analog reference signal AVREF is completed, the switch SW422 is turned on based on the selection signal SEL422. Then, the analog reference signal AVREF held in the sample-and-hold circuit 432 is output to the A/D conversion unit 50. The A/D conversion unit 50 converts the analog reference signal AVREF into a digital signal (CONVERT VREF), and outputs an A/D conversion result DVREF.

In parallel with the conversion operation (CONVERT VREF) of the analog reference signal AVREF described above, the selection signal SEL32 is activated. Thus, the analog input signal A1_0 of the input channel 1 is supplied to the sample-and-hold unit 40. Further, the selection signal SEL411 is activated, the analog input signal A1_0 of the input channel 1 is sampled and held in the sample-and-hold circuit 431 (SAMPLING A1_0). Thus, the sampling operation of the analog input signal A1_0 is performed during the analog reference signal AVREF selected prior to the input channel 1 is converted into a digital signal by the A/D conversion unit 50. When the sampling operation of the analog input signal A1_0 is completed, the switch SW421 is turned on based on the selection signal SEL421. Then, analog input signal A1_0 held in the sample-and-hold circuit 431 is output to the A/D conversion unit 50. The A/D conversion unit 50 converts the analog input signal A1_0 into a digital signal (CONVERT A1_0) and outputs an A/D conversion result D1_0.

Furthermore, the selection signal SEL33 and the selection signal SEL412 are activated in parallel with the conversion operation (CONVERT A1_0) of the analog input signal A1_0 of the input channel 1. Thus, the analog reference signal AVREF is supplied to the sample-and-hold circuit 432 and sampled (SAMPLING VREF) to the sample-and-hold circuit 432. When the sampling operation of the analog reference signal AVREF is completed, the switch SW422 is turned on based on the selection signal SEL422. Then, the analog reference signal AVREF held in the selected sample-and-hold circuit 432 is output to the A/D conversion unit 50. A/D conversion unit 50 converts the analog reference signal AVREF into a digital signal (CONVERT VREF), and outputs an A/D conversion result DVREF.

Thereafter, the input selector 30 alternately selects the analog input signal A0, A1 of the input channel and the analog reference signal AVREF, and the sample-and-hold unit 40 repeats the sampling operation and the output operation of the analog input signal of the input channel and the analog reference signal AVREF in parallel.

In this way, the control unit 80 controls the switches SW31-SW33 in the input selector 30 so that the analog reference signal AVREF is supplied to the sample-and-hold unit 40 after the sampling operation of the analog input signal of input channel by the sample-and-hold unit 40. The control unit 80 controls the switches SW411 and SW421 in the first selection unit 410 and the switches SW421 and SW422 in the second selection unit 420 so that one of the sample-and-hold circuits 431 and 432 performs sampling operation and the other of the sample-and-hold circuits 431 and 432 performs output operation to the A/D conversion unit 50. As a result, the conversion result of the analog input signal of the input channel and the conversion result of the analog reference signal AVREF are output alternately, as the output ADOUT of the A/D conversion unit 50.

Further, the AD converter 18 according to first embodiment includes a plurality of sample-and-hold circuits, the analog input signal of the input channel and the analog reference signal are sampled in different sample-and-hold circuits. Thus, the AD converter 18 according to first embodiment, the output operation of the analog input signal of the input channel to the A/D conversion unit 50 (i.e., AD conversion operation), and the sampling operation of the analog reference signal AVREF can be performed in parallel. Furthermore, the AD converter 18 according to first embodiment can perform the output operation of the analog reference signal AVREF to the A/D conversion unit 50 and the sampling operation of the analog input signal of the input channels in parallel. That is, the A/D conversion operation of the analog input signal of the input channel and the A/D conversion operation of the analog reference signal AVREF for self-diagnosis are performed in parallel. Therefore, while performing the A/D conversion operation of the analog input signal from the input channel, even if performing the A/D conversion operation of the analog reference signal for self-diagnosis, the A/D conversion operation of the analog input signal of each input channel is not interrupted. That is, without affecting the A/D conversion operation of the analog input signal of the input channel, it is possible to perform self-diagnosis of the AD converter 18.

According to the AD converter 18 according to first embodiment, the user does not need to set a self-diagnosis period that can be set by shifting from the normal mode to the self-diagnosis mode by using software or the like. Therefore, it is not necessary to limit the execution timing of the self-diagnosis, so that the functional safety can be improved.

Second Embodiment

Figure 5:
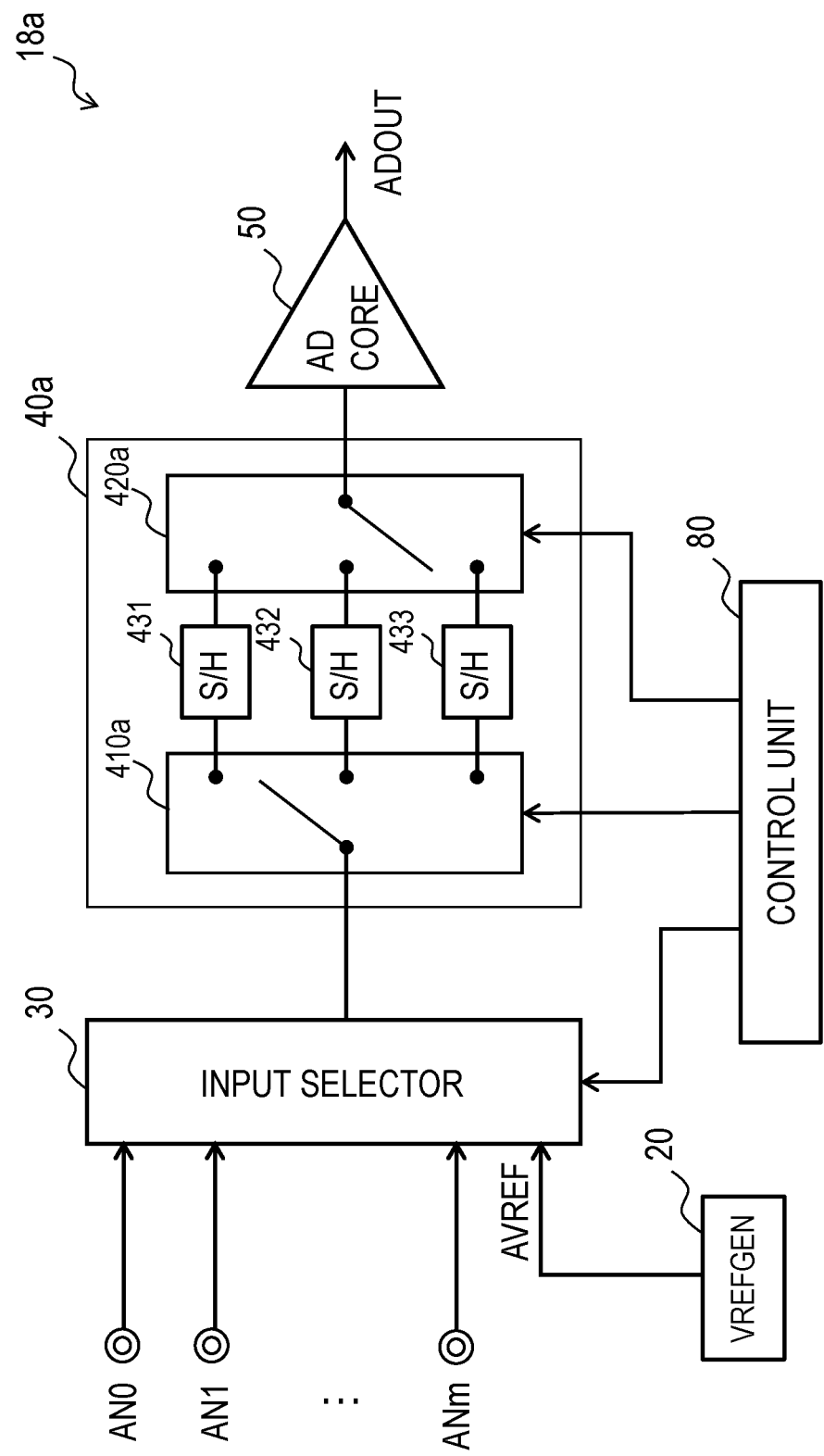
FIG. 5 is a block diagram showing an exemplary configuration of an AD converter according to second embodiment.

Next, second embodiment will be described. In second embodiment, an AD converter 18a which is another embodiment of the AD converter 18 described first embodiment will be described. FIG. 5 is a block diagram showing an exemplary configuration of an AD converter 18a according to second embodiment. In second embodiment, the configuration of the AD converter 18a other than the sample-and-hold unit 40a may be the same as that shown in FIG. 2. Therefore, in FIG. 5, components having the same functions as those in FIG. 2 of the embodiment are denoted by the same reference numerals, and descriptions thereof are omitted.

As shown in FIG. 5, the sample-and-hold unit 40a further includes a sample-and-hold circuit 433, which is also referred to as a third sample-and-hold circuit. The sample-and-hold unit 40a has a first selection unit 410a instead of the first selection unit 410 shown in FIG. 2 of the embodiment in accordance with the addition of the sample-and-hold circuit 433. Similarly, the sample-and-hold unit 40a has a second selection unit 420a instead of the second selection unit 420 shown in FIG. 2 of the embodiment. The first selection unit 410a selects any one of the sample-and-hold circuits 431-433, and connects the selected sample-and-hold circuit to the input selector 30. That is, the analog signal output from the input selector 30 is supplied to the sample-and-hold circuit selected by the first selection unit 410a and sampled. The second selection unit 420a selects any one of the sample-and-hold circuits 431-433, and connects the selected sample-and-hold circuit to the A/D conversion unit 50. That is, the analog signal held in the sample-and-hold circuit selected by the second selection unit 420a is supplied to the AD conversion unit 50, and is converted into a digital signal. Incidentally, similarly to first embodiment, by providing a plurality of sample-and-hold circuits, the output operation to the conversion unit 50 and the sampling operation in the sample-and-hold unit 40a are performed in parallel.

Figure 6:
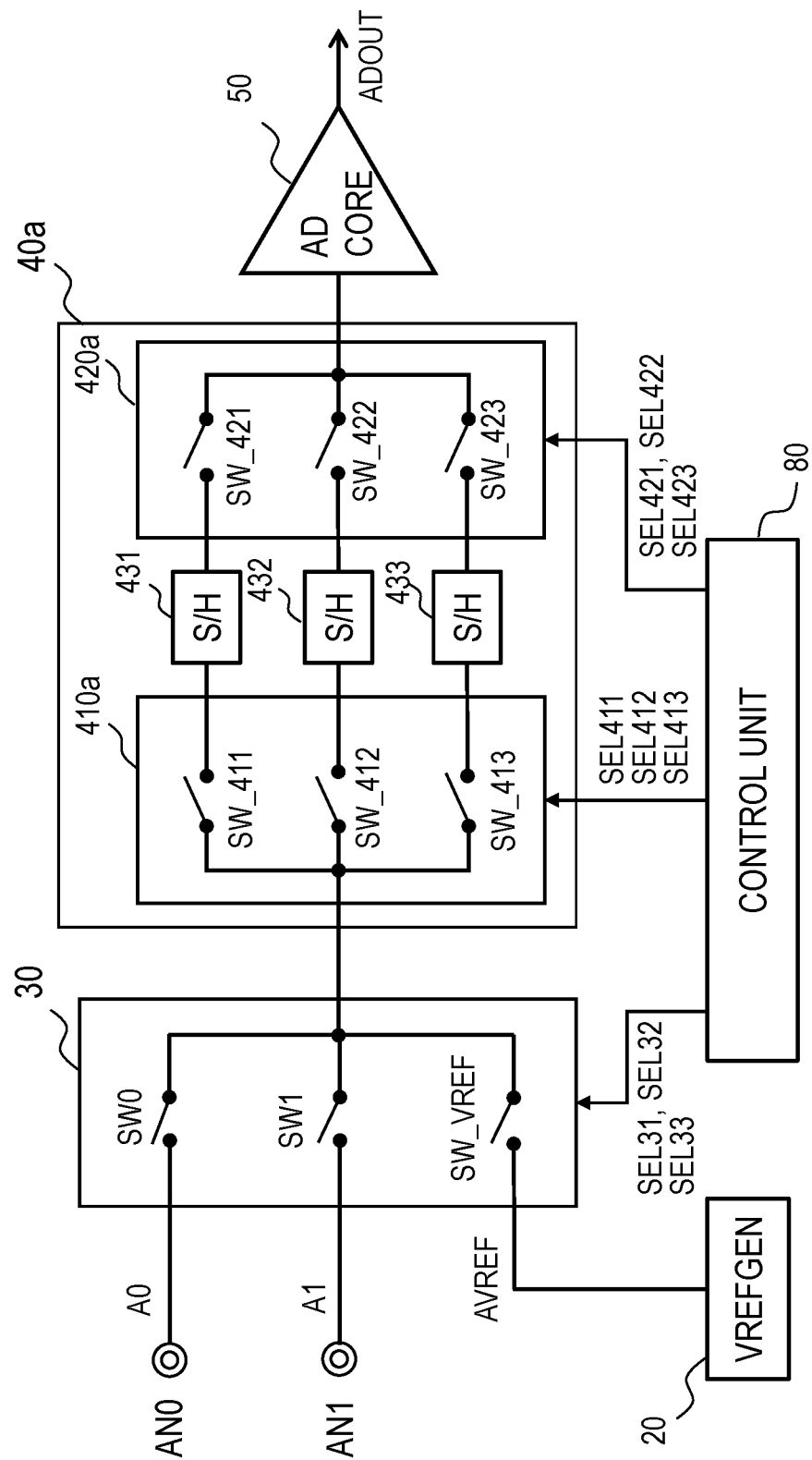
FIG. 6 is a block diagram showing an exemplary configuration of an AD converter according to second embodiment.

In FIG. 6, a specific configuration example of the first selection unit 410a and the second selection unit 420a in the AD converter 18a of second embodiment is shown. In FIG. 6, it is assumed that the AD converter 18a performs A/D conversion operation of the analog input signal A0 of the input channel 0 (corresponding to the analog input terminal AN0) and the analog input signal A1 of the input channel 1 (corresponding to the analog input terminal AN1).

The first selection unit 410a has switches SW411-SW413 corresponding to the sample-and-hold circuits 431-433. The switches SW411-SW413 are turned on or off by the selection signals SEL411-SEL413 output from the control circuit 80, respectively, the sample-and-hold circuit for sampling the analog signal selected by the input selector 30 is selected.

The second selection unit 420a has switches SW421-SW423 corresponding to the sample-and-hold circuits 431-433. The switches SW421-SW423 are turned on or off by the corresponding one of selection signal SEL421-SEL423 output from the control circuit 80, respectively, the analog signal held in the selected sample-and-hold circuit is output to the A/D conversion unit 50.

Operation of the AD Converter Related to Second Embodiment

Figure 7:
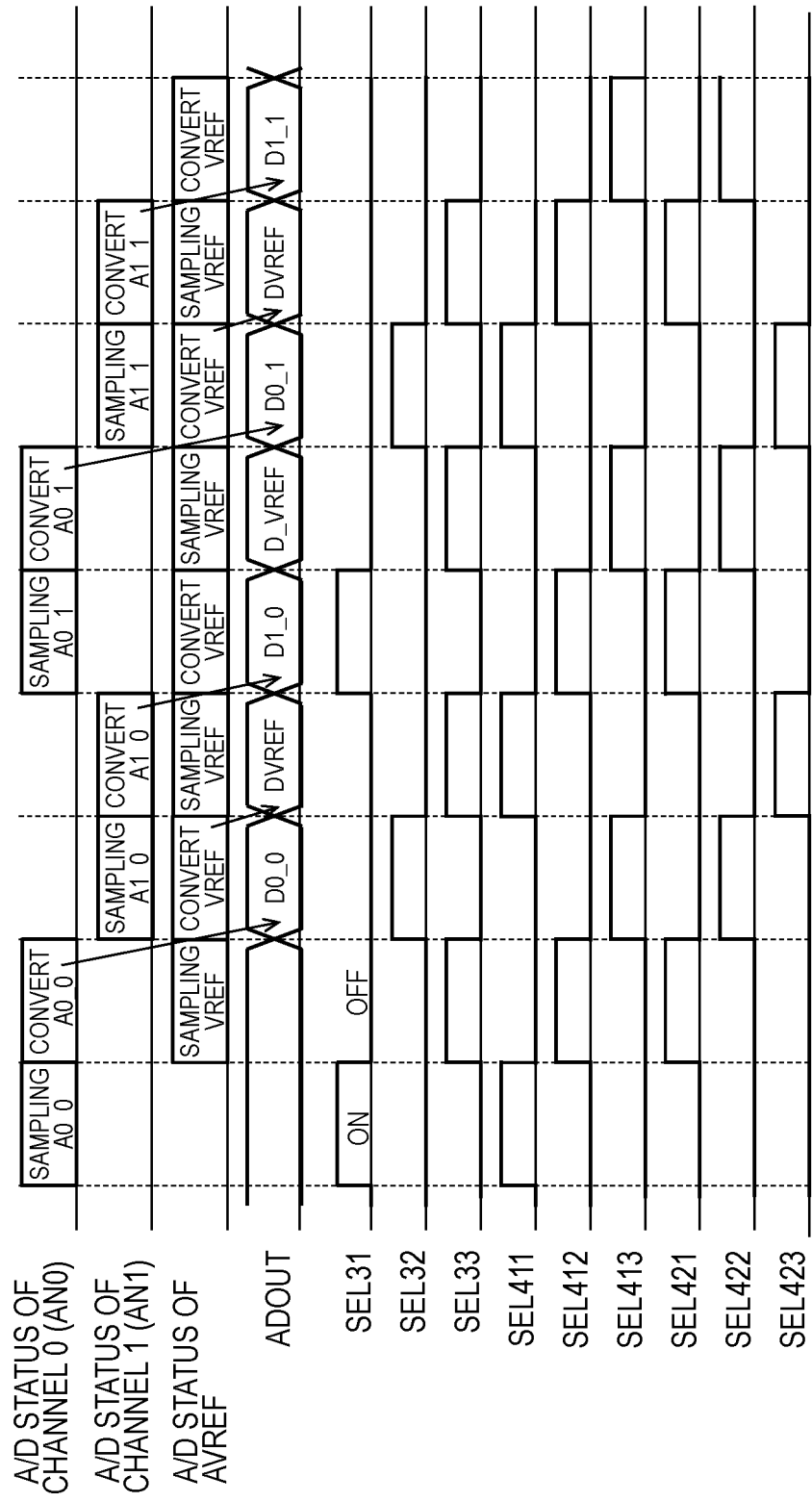
FIG. 7 is a timing chart for explaining the operation of the AD converter according to second embodiment.

Referring to FIG. 7, the operation of the AD converter 18a shown in FIG. 6 will be described.

The AD converter 18a according to second embodiment performs the sampling operation in the sample-and-hold unit 40a and the outputting operation to the A/D conversion unit 50 in parallel, similarly to first embodiment. Further, the analog signal selected by the input selector 30 is sequentially sampled and held in three sample-and-hold circuits 431-433 in the sample-and-hold unit 40a.

Specifically, as shown in FIG. 7, the input channel 0 is selected based on the selection signal SEL31, the analog input signal A0_0 of the input channel 0 is sampled to the sample-and-hold circuit 431 selected by the selection signal SEL411 (SAMPLING A0_0). The analog input signal A0_0 held in the sample-and-hold circuit 431 is output to the A/D conversion unit 50 based on the selection signal SEL421 to be activated, the conversion operation of the analog input signal A0_0 by the analog conversion unit 50 is performed (CONVERT A0_0).

In parallel with the converting operation (CONVERT A0_0) of the analog input signal A0_0, the selection signal SEL33 is activated, and the analog reference signal AVREF is selected following the input channel 0. The analog reference signal AVERF is sampled and held based on the select signal SEL412 in a sample-and-hold circuit 432 that differs from the sample-and-hold circuit 431 that holds the analog input signal A0_0 of the previously selected input channel 0 (SAMPLING VREF). Then, the selection signal SEL422 is activated, the analog reference signal AVREF held in the sample-and-hold circuit 432 is output to the A/D conversion unit 50, thus, the conversion operation of the analog reference signal AVEF is performed (CONVERT VREF).

In parallel with the conversion operation (CONVERT VREF) of the analog reference signal AVREF, the selection signal SEL32 is activated and input channel 1 is selected. The analog input signal A1_0 of input channel 1 is sampled and held by a sample-and-hold circuit 433 that differs from the sample-and-hold circuit 432 that holds the previously selected analog reference signal AVREF based on the selection signal SEL413 (SAMPLING A1_0). Subsequently, the selection signal SEL423 is activated, the analog input signal A1_0 held in the sample-and-hold circuit 433 is output to the A/D conversion unit 50, the conversion operation of the analog input signal A1_0 is performed (CONVERT A1_0).

In parallel with the converting operation (CONVERT A1_0) of the analog input signal A1_0, the selection signal SEL33 is activated, and the analog reference signal AVREF is selected again. The analog reference signal AVREF is sampled and held in the sample-and-hold circuit 431 based on the selection signal SEL411 (SAMPLING VREF). Subsequently, the selection signal SEL421 is activated, the analog reference signal AVREF held in the sample-and-hold circuit 431 is output to the A/D conversion unit 50, the conversion operation of the analog reference signal AVREF is performed (CONVERT VREF).

Thereafter, the AD converter 18a alternately selects the analog input signal of the input channel (A0, A1) and the analog reference signal AVREF, and repeats the sampling operation and the converting operation of the analog input signal and the analog reference signal AVREF of the input channel in parallel.

As described above, according to second embodiment, substantially the same effects as those of first embodiment can be obtained by providing three sample-and-hold circuits. That is, in parallel with the A/D conversion operation of the analog input signal of the input channel, it is possible to perform A/D conversion operation of the analog reference signal AVREF for self-diagnosis. Therefore, it is not necessary to interrupt the A/D conversion operation of the analog input signal of each input channel for A/D conversion operation of the analog reference signal for self-diagnosis.

Furthermore, according to second embodiment, the AD converter 18a alternately selects the analog input signal of the input channel and the analog reference signal AVREF, and sequentially captures the selected signals into the three sample-and-hold circuits 431-433. Therefore, the analog reference signal AVREF is captured into the different sample-and-hold circuit each time it is selected. That is, the A/D conversion unit 50 converts the analog reference signal AVREF via different sample-and-hold circuits. Therefore, by performing self-diagnosis using the conversion result of the analog reference signal AVREF supplied to the A/D conversion unit 50 through different paths, it is possible to detect a path failure from the input selector 30 to the A/D conversion unit 50. In other words, a failure can be detected with respect to a plurality of sample-and-hold circuits. For example, it is possible to diagnose the disconnection of the path in the sample-and-hold unit and the fixation of the signal line to the power supply or the GND.

When two sample-and-hold circuits are used to perform the A/D conversion operation of the analog input signal of the input channel and the A/D conversion operation of the analog reference signal for self-diagnosis in parallel and alternately, the analog reference signal AVREF for self-diagnosis may be captured only in one of the two sampling-and-hold circuits. When the AD converter 18a performs the A/D conversion operations of the analog reference signals AVREF which pass through each of two sample-and-hold circuits, in order to detect a path failure from the input selector 30 to the A/D conversion unit 50, it may have to interrupt the A/D conversion operation for the analog input signals of the input channels. However, according to second embodiment, since it has three sample-and-hold circuits, without interrupting the A/D conversion operation for the analog input signals of the input channels, the analog reference signals AVREF via different sample-and-hold circuits can be used for self-diagnosis.

In second embodiment, the sample-and-hold unit 40 has three sample-and-hold circuits 431-433. When performing A/D conversion operation of the analog reference signal for the self-diagnosis and A/D conversion operation of the analog input signal in parallel, the sample-and-hold circuits may be provided with three or more odd number.

Modified Example of Second Embodiment

Figure 8:
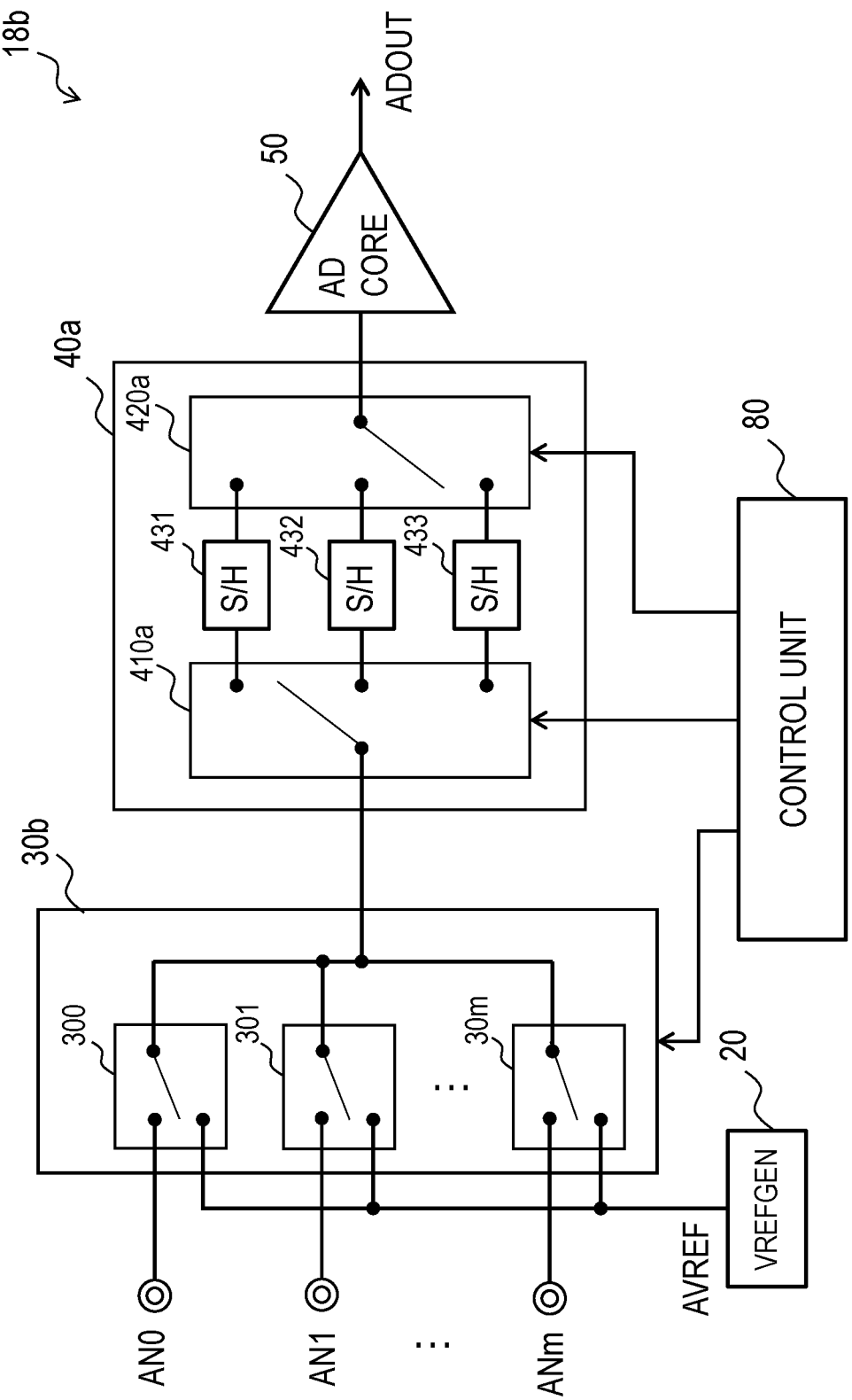
FIG. 8 is a block diagram showing an exemplary configuration of an AD converter according to modified example of second embodiment.

Next, modified example of second embodiment will be described. In this modified example, in order to detect a path failure from each input channel (each analog input terminal), selection circuits each corresponding to the input channel are provided. FIG. 8 is a block diagram showing an exemplary configuration of the AD converter 18b according to modified example of second embodiment. In modified example of second embodiment, the configuration other than the input selector 30b may be the same as that shown in FIG. 5. Therefore, their descriptions are omitted here. In the configuration shown in FIG. 8, components having the same functions as those in FIG. 5 of the embodiment, are denoted by the same numerals and descriptions thereof are omitted.

As shown in FIG. 8, the input selector 30b includes selection circuits 300-30m corresponding to the analog input terminals AN0-ANm, respectively. In other words, the input selector 30b includes selection units 300-30m provided for each input channel. Each of the selection circuits 300-30m is connected the corresponding analog input terminal and the reference signal generation circuit 20 to select and output one of the analog reference signal AVREF and the analog input signal to be input to the corresponding analog input terminal. These selection circuits 300-30m are controlled by the control unit 80. The control circuit 80 controls the input selector 30b so as to output an output signal of any one of the selection circuits 300-30m to the sample-and-hold unit 40a.

Figure 9:
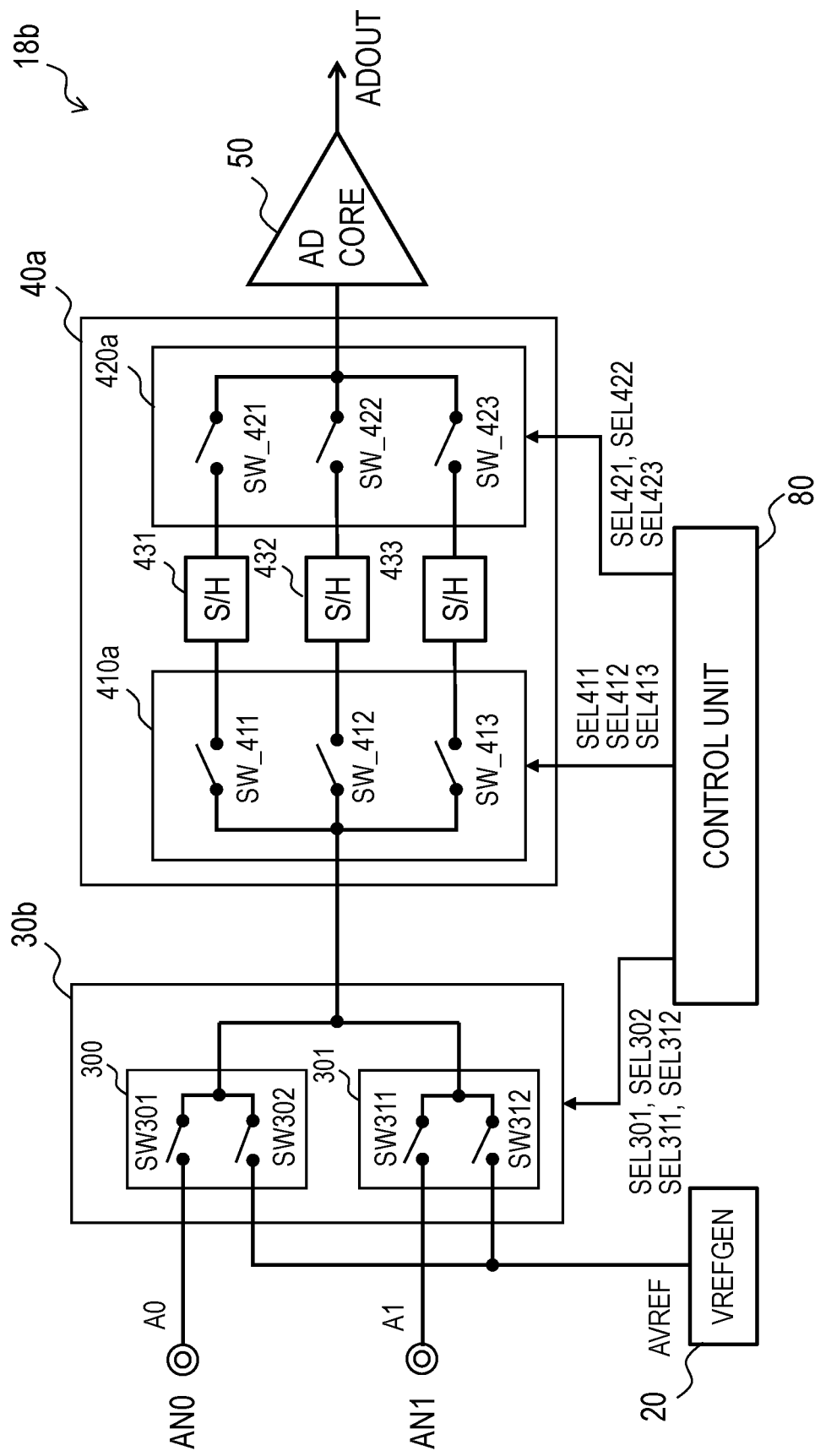
FIG. 9 is a diagram showing an exemplary configuration of an AD converter according to modified example of second embodiment.

FIG. 9 is a block diagram showing an AD converter 18b including an example of a specific configuration of the input selector 30b in modified example of second embodiment. In FIG. 9, it is assumed that the AD converter 18b performs A/D conversion operation of the analog input signal A0 of the input channel 0 (corresponding to the analog input terminal AN0) and the analog input signal A1 of the input channel 1 (corresponding to the analog input terminal AN1) in the same manner as the above-described second embodiment.

The input selector 30b includes selection circuits 300 and 301 corresponding to the input channel 0 and the input channel 1. The selection circuit 300 includes switches SW301 and SW302.

The switches SW301 and SW302 are turned on or off based on the selection signal SEL301 and SEL302 output from the control unit 80, respectively. Therefore, in response to the selection signals SEL301 and SEL302, the selection circuit 300 selects and outputs one of the analog input signal A0 of the input channel 0 and the analog reference signal AVREF. Hereinafter, the analog reference signal AVREF selected by the selection circuit 300 is referred to as the analog reference signal AVREF of the input channel 0. The selection circuit 301 also includes switches SW311 and SW312. The switches SW311 and SW312 are switched on or off based on the selection signals SEL311 and SEL312 output from the control unit 80, respectively. Therefore, the selection circuit 301 outputs either the analog input signal A1 of the input channel 1 or the analog reference signal AVREF in accordance with the selection signals SEL311 and SEL312. Hereinafter, the analog reference signal AVREF selected by the selection circuit 301 is referred to as the analog reference signal AVREF of the input channel 1. The analog reference signal AVREF of the input channel 0 selected by the selection circuit 300 is input to the A/D conversion unit 50 via the same path as the analog input signal A0 of the input channel 0. The analog reference signal AVREF of the input channel 1 selected by the selection circuit 301 is input to the A/D conversion unit 50 via the same path as the analog input signal A1 of the input channel 1.

The selection signals SEL301, SEL302, SEL311 and SEL312 are controlled by the control unit 80 so that one of them becomes active.

Operation of AD Converter for Modified Example of Second Embodiment

Figure 10:
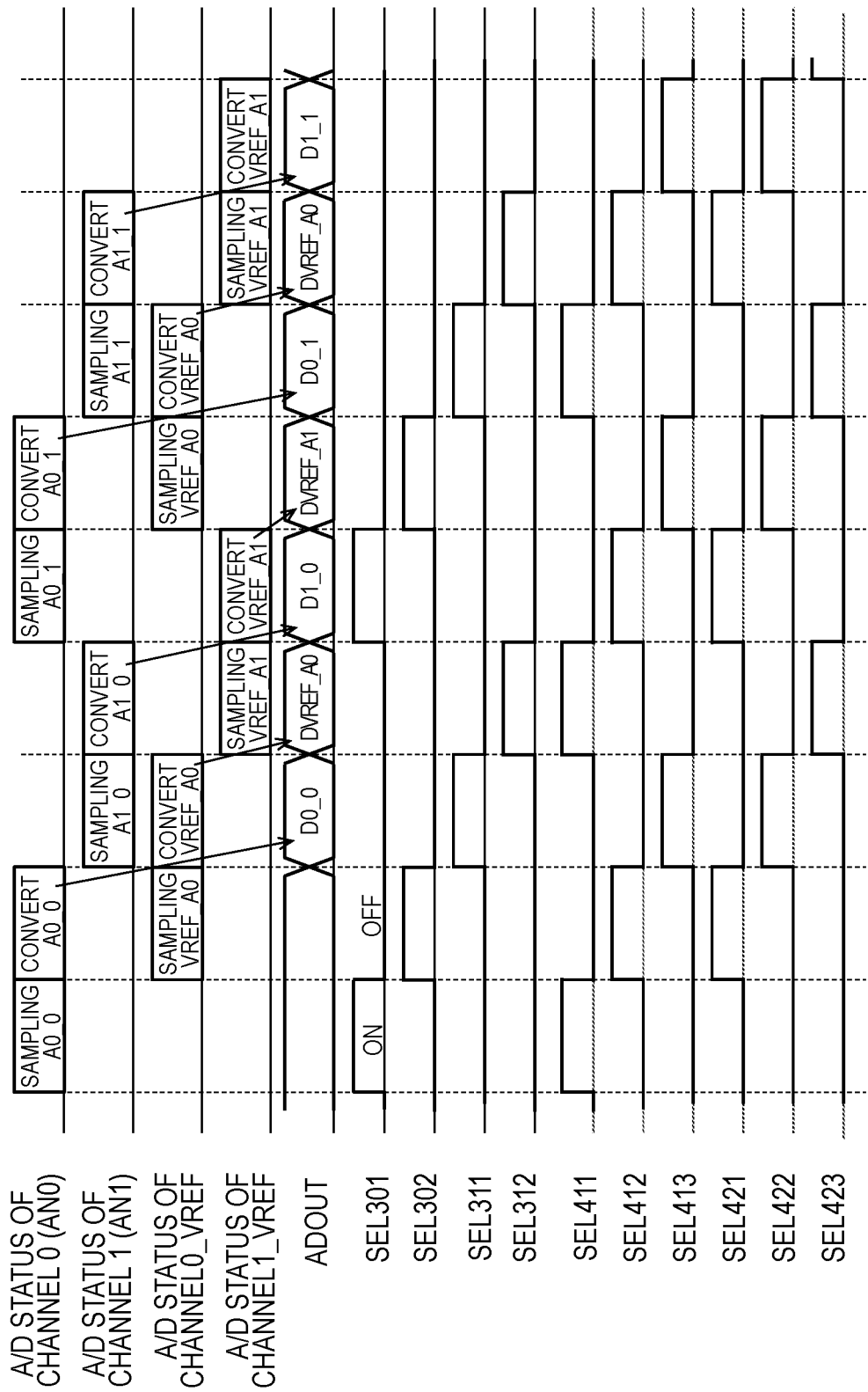
FIG. 10 is a timing chart illustrating the operation of the AD converter according to modified example of second embodiment.

Referring to FIG. 10, the operation of the AD converter 18b shown in FIG. 9 will be described. The AD converter 18b, similarly to the AD converter 18a of FIG. 6, performs A/D conversion operation of the analog input signal of the input channel and A/D conversion operation of the analog reference signal AVREF in parallel. Specifically, the sample-and-hold unit 40a performs the sampling operation and the output operation to the A/D conversion unit 50 in parallel. Similarly to second embodiment, the analog signals selected by the input selector 30b are sequentially sampled by the first to third sample-and-hold circuits 431-433 of the sample-and-hold unit 40a.

As shown in FIG. 10, the analog input signal A0_0 of the input channel 0 is selected based on the selection signal SEL301. The analog input signal A0_0 is sampled by the sample-and-hold circuit 431 based on the selection signal SEL411 (SAMPLING A0_0). The analog input signal A0_0 held in the sample-and-hold circuit 431 is output to the A/D conversion unit 50 based on the selection signal SEL421 to convert into a digital signal (CONVERT A0_0). The select signals SEL302 and SEL412 are activated in parallel with the conversion operation of the analog input signal A0_0, the analog reference signal AVREF of input channel 0 is selected and sampled by the sample-and-hold circuit 432 (SAMPLING VREF_A0). The analog reference signal AVREF sampled by the sample-and-hold circuit 432 is output to the A/D conversion unit 50 based on the selection signal SEL422 to convert into a digital signal (CONVERT VREF_A0). At this time, the selection signals SEL311 and SEL413 are activated, the analog input signal A1_0 of the input channel 1 is sampled by the sample-and-hold circuit 433 (SAMPLING A1_0). Subsequently, the analog input signal A1_0 sampled by the sample-and-hold circuit 433 is output to the A/D conversion unit 50 based on the selection signal SEL423 to convert into a digital signal (CONVERT A1). Furthermore, in parallel with the conversion operation of the analog input signal A1_0, the selection signals SEL312 and SEL411 are activated, the analog reference signal AVREF of the input channel 1 is sampled by the sample-and-hold circuit 431 (SAMPLING VREF_A1). Thus, the AD converter 18b sequentially selects the analog input signal and the corresponding analog reference signal of each input channel, and performs in parallel the sampling operation and the conversion operation. The analog converter 18b repeats such operations.

The modified example of second embodiment provides substantially the same effects as second embodiment. Furthermore, according to modified example of second embodiment, since the self-diagnosis is performed using the analog reference signal that passes through the path of the analog input signal of each input channel, a path failure from the input selector 30b to the A/D conversion unit 50 can also be detected. For example, it is possible to diagnose disconnection of the path from the input selector 30b to the A/D conversion unit 50 and fixation with the power supply or the GND.

Third Embodiment

Figure 11:
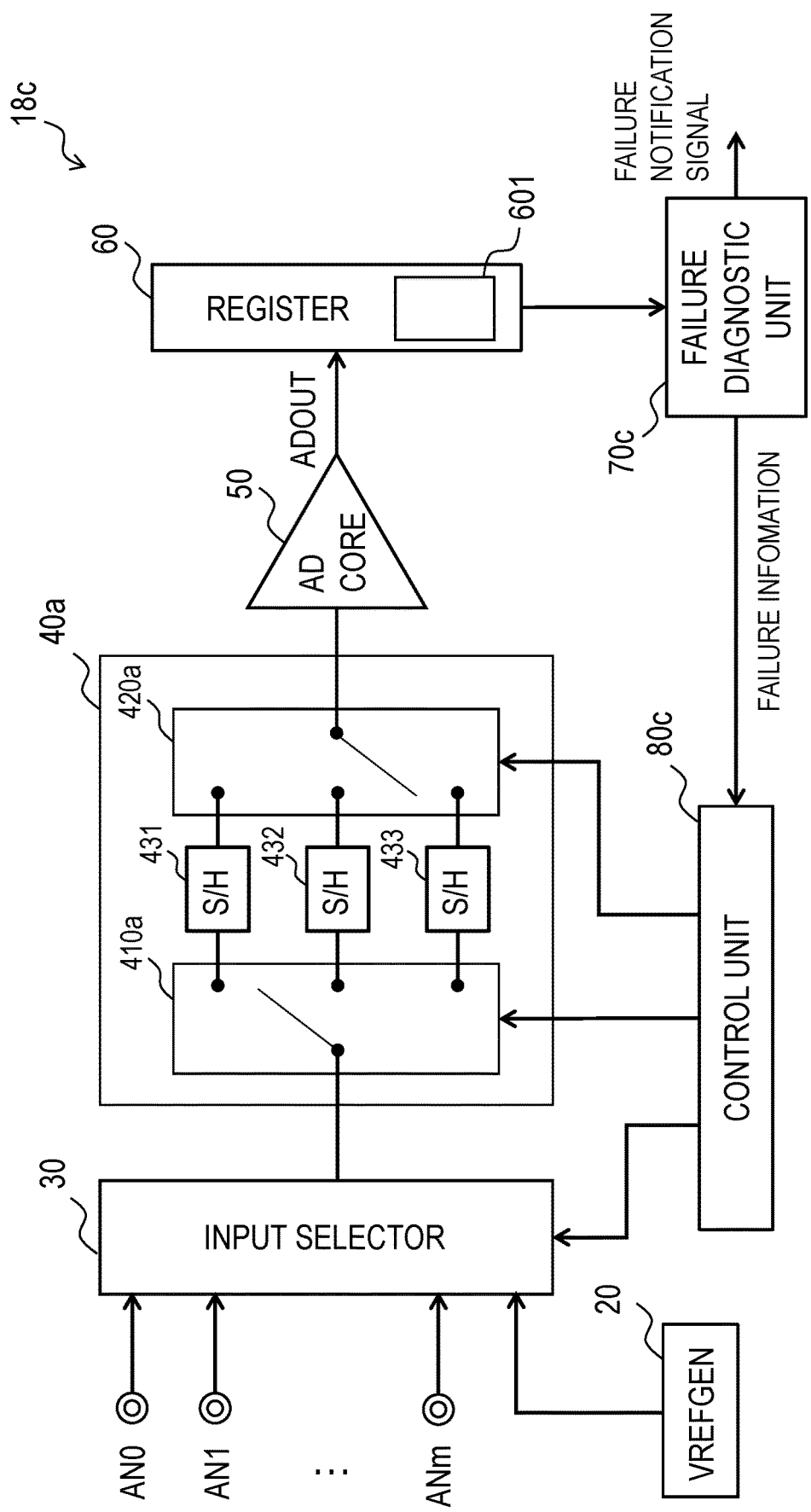
FIG. 11 is a block diagram showing an exemplary configuration of an AD converter according to third embodiment.

Next, third embodiment will be described. FIG. 11 is a block diagram showing an exemplary configuration of an AD converter 18c according to third embodiment. The AD converter 18c is difference from the AD converter 18a shown in FIG. 5 in a control by the failure diagnostic unit 70c. In third embodiment, components having the same functions as those of second embodiment shown in FIG. 5 are denoted by the same reference numerals, and descriptions thereof are omitted.

The AD converter 18c according to third embodiment, similarly to the AD converter 18a of second embodiment, the analog input signal of the input channel and the analog reference signal AVREF are input alternately. Furthermore, the A/D conversion operation of the analog input signal of the input channel is performed in parallel with the A/D conversion of the analog reference signal AVREF for self-diagnosis. The A/D conversion result of the analog reference signal AVREF is held in the reference signal conversion result register 601 included in the conversion result holding register 60. The reference signal conversion result register 601 holds path information together with the conversion result. The path information is information on a path in the sample-and-hold unit 40a, and is, for example, identifying information indicating the analog reference signal AVREF is transmitted from which sample-and-hold circuit to the A/D conversion unit 50.

The failure diagnostic unit 70c reads the conversion result of the analog reference signal AVREF stored in the reference signal conversion result register 601, and compares it with the expected value. The failure diagnostic unit 70c performs failure diagnosis operation based on the comparison result, and outputs a failure notification signal. Further, when it is diagnosed that a failure has occurred, the failure diagnostic unit 70c generates failure information based on the path information corresponding to the analog reference signal AVREF to be diagnosed, and transfers the generated failure information to the control unit 80c.

The control unit 80c receives the failure information from the failure diagnostic unit 70c, and controls the first selection unit 410a and the second selection unit 420a based on the failure information. Specifically, based on the failure information, the first selection unit 410a and the second selection unit 420a are controlled so as not to select the sample-and-hold circuit on the path diagnosed as having the failure.

Figure 12:
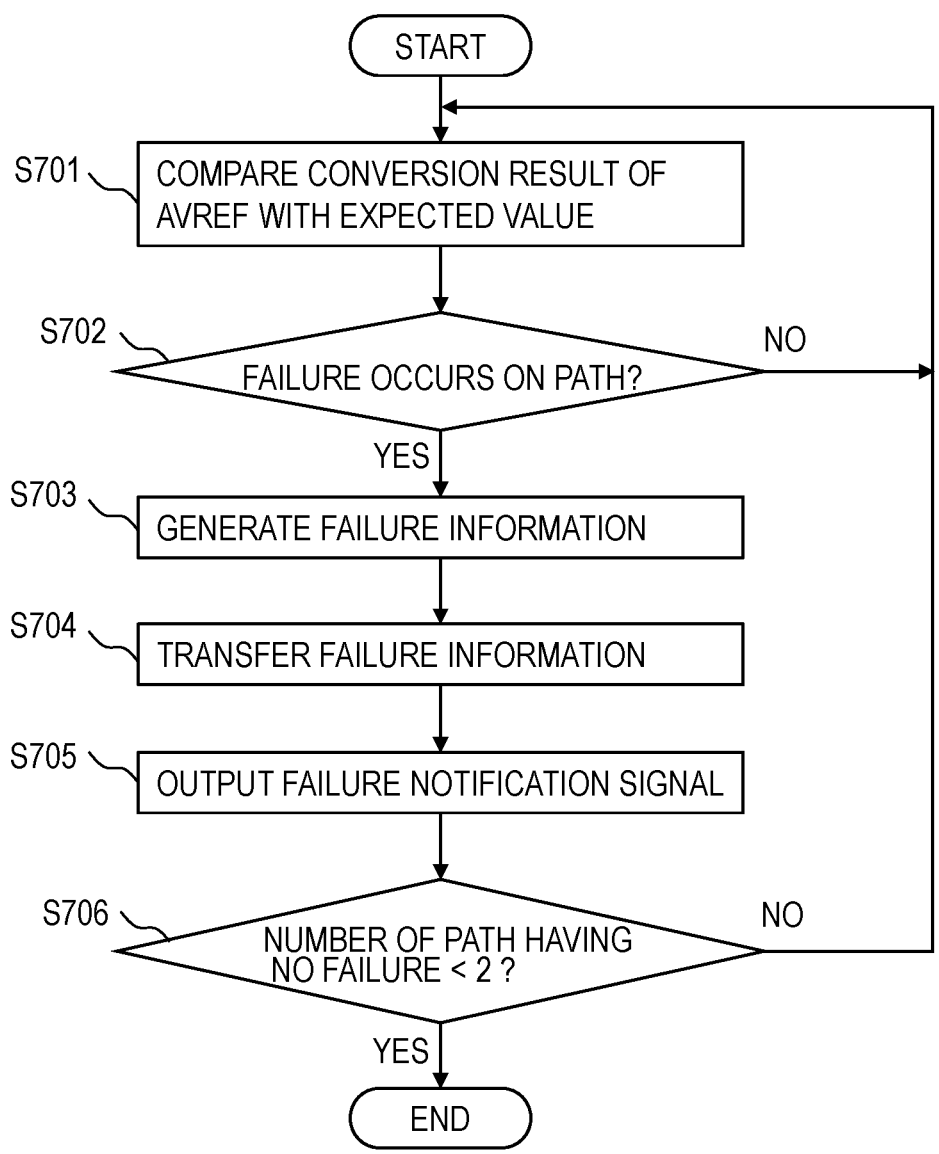
FIG. 12 is a flow chart showing the process of the failure diagnostic unit according to third embodiment.

Next, the operation of the failure diagnostic unit 70c will be described with reference to FIG. 12. FIG. 12 is a flow chart showing the operation of the failure diagnostic unit 70c according to third embodiment.

First, the failure diagnostic unit 70c reads the conversion result of the analog reference signal AVREF stored in the reference signal conversion result register 601, and compares the conversion result of the analog reference signal AVREF with the expected value (S701).

When the failure diagnostic unit 70c determines that there is no failure on the path through which the analog reference signal AVREF to be compared passes based on the comparison result (NO in S702), the control unit 80c continues the same operation as second embodiment. Therefore, the failure diagnostic unit 70c returns to S701 and compares the conversion result of the following analog reference signal AVREF.

On the other hand, when the failure diagnostic unit 70c determines based on the comparison result that a failure is present on the path through which the analog reference signal AVREF to be compared passes (YES in S702), and the failure diagnostic unit 70c generates the failure information based on the path information read together with the conversion result of the analog reference signal AVREF to be compared (S703) to transfer the generated failure information to the control unit 80c (S704). Further, the failure diagnostic unit 70c outputs the failure notification signal (S705).

Next, the failure diagnostic unit 70c confirms the number of paths in which no failure has occurred. If there are less than two paths for which no failure has occurred, i.e., only one, it is impossible to perform A/D conversion operation of the analog input signal of the input channel and A/D conversion operation of the analog reference signal AVREF for self-diagnosis in parallel as in first embodiment or second embodiment. Still, when performing A/D conversion operation of AVREF of the analog reference signal for self-diagnosis, it is necessary to change the A/D conversion timing of the analog input signal of the input channel. Therefore, when there is only one path in which a failure has not occurred (YES in S705), the control unit 80c instructs the input selector 30 not to select the analog reference signal AVREF, and thus the failure diagnosis operation by the failure diagnostic unit 70c is stopped. On the other hand, when there are two or more paths failure has not occurred (NO in S705), as in first embodiment or second embodiment, it is possible to perform A/D conversion operation of the analog reference signal for self-diagnosis without shifting the A/D conversion timing of the analog input signal of the input channel. Therefore, if there are two or more paths in which no failure has occurred (NO in S706), the process returns to S701 to continue the failure diagnostics.

The failure information output from the failure diagnostic unit 70 is input to the control unit 80c and reflected in the control of the first selection unit 410a and the second selection unit 420a. Specifically, the control unit 80c controls the first selection unit 410a and the second selection unit 420a so as not to select the sample-and-hold circuit indicated in the failure information. Therefore, even if there is a failure in a part of the sample-and-hold circuits included in the sample-and-hold unit 40a, the A/D conversion operation of the analog input signal of each input channel can be continuously performed.

For example, if it is determined that a failure has occurred in the path through the sample-and-hold circuit 431, the control unit 80c controls the first selection unit 410a and the second selection unit 420a so as to alternately select the remaining two sample-and-hold circuits 432 and 433 except the sample-and-hold circuit 431. In this way, A/D conversion operation of the analog reference signal AVREF for self-diagnosis can also be performed while continuing A/D conversion operation of the analog input signal of the input channel, as in first embodiment.

Further, when it is determined that a failure has occurred in the two paths through the sample-and-hold circuits 431 and 432 among the three paths via the sample-and-hold circuits 431-433, the control unit 80c controls the first selection unit 410a and the second selection unit 420a so as to perform A/D conversion using only the path through the sample-and-hold circuit 433. In this case, since only one sample-and-hold circuit is available, the sampling operation and the conversion operation cannot be performed in parallel. Therefore, the control unit 80c further to the input selector 30 controls so as not to select the analog reference signal AVREF for self-determination. Thus, although it is impossible to perform failure diagnosis operation of the AD converter 18c, the A/D conversion operation of the analog input signal of the input channel can be continued.

In S704 of FIG. 12, the failure diagnostic unit 70c may output the fault notification signals corresponding to the number of paths diagnosed as faults. In this manner, the interrupt controller 13 receiving the failure notification signal may generate an interrupt signal associated with the number of failure paths, and CPU 10 may select an appropriate interrupt process for ensuring safety based on the interrupt signal. For example, if a failure is detected on a path through the sample-and-hold circuit 432 and no fault is detected on the path through the remaining sample-and-hold circuits 431 and 433, it may be a fault in the sample-and-hold circuit 432. In this case, simply by not selecting the sample-and-hold circuit 432, A/D conversion operation of the analog input signal of the input channel can continue. As a result, there is a possibility that the operation of the MCU can continue. On the other hand, if failures are detected on the path through the sample-and-hold circuit 432 and on the path through the sample-and-hold circuit 433 and a fault is not detected only on the path through the remaining sample-and-hold circuit 431, the A/D conversion operation of the analog input signal of the input channel can be continued by using only the sample-and-hold circuit 431. However, in this case, it is impossible to perform self-diagnosis of the AD converter 18c without changing the A/D conversion timing of the analog input signal of the input channel. The CPU 10 can take these into account and proceed to an appropriate process.

As described above, according to third embodiment, the control unit 80c controls the first control units 410a and 420a based on the diagnosis result of the failure diagnostic unit 70c. Thus, it is possible to continue the A/D conversion operation of at least the analog input signal of the input channel using a sample-and-hold circuit other than the sample-and-hold circuit on the path which is diagnosed that a failure has occurred.

Although it has been described in first embodiment to third embodiment the sampling operation and the conversion operation of the analog reference signal are performed in parallel with the conversion operation of the analog input signal previously selected and the sampling operation of the analog input signal next selected, either one of the operations may be performed in parallel according to the acquisition timing of the analog signal by the external sensor.

Although the invention made by the present inventor has been specifically described based on the embodiment, the present invention is not limited to the embodiment described above, and it is needless to say that various modifications can be made without departing from the gist thereof.

What is claimed is:

1. An analog-to-digital (AD) converter comprising:
   a plurality of analog input terminals;
   a reference signal generation circuit generating an analog reference signal;
   a sample-and-hold unit including a plurality of sample-and-hold circuits, each of the sample-and-hold circuits sampling the analog reference signal or one of analog input signals inputted to the analog input terminals;
   a controller controlling the sample-and-hold unit;
   a conversion core converting an output signal from the sample-and-hold unit into a digital signal;
   a conversion result storage register storing a conversion result outputted from the conversion core; and
   a failure diagnostic processor comparing a conversion result of the analog reference signal stored in the conversion result storage register with an expected value,
   wherein the controller controls the sample-and-hold unit to perform an output operation of the analog input signal and a sampling operation of the analog reference signal in parallel,
   wherein the conversion result storage register stores an identification information for identifying a path of the analog reference signal in the sample-and-hold circuit with the conversion result of the analog reference signal,
   wherein the failure diagnostic processor, when the failure diagnostic processor detects a failure based on the compared conversion result of the analog reference signal, transfers the identification information corresponding to the analog reference signal which the failure is detected to the controller, and
   wherein the controller controls the sample-and-hold unit so that the analog reference signal is not sampled and held by the sample-and-hold circuit identified by the identification information.

2. The AD converter according to claim 1, wherein the controller controls the sample-and-hold unit so as to perform the output operation for the analog reference signal and the sampling operation for the analog input signal inputted into the sample-and-hold circuit following the analog reference signal in parallel.

3. The AD converter according to claim 1, further comprising an input selector connected to the analog input terminals and the reference signal generation circuit,
   wherein the input selector selects the analog reference signal or one of the analog input signals to output to the sample-and-hold unit.

4. The AD converter according to claim 3, wherein the input selector alternately selects the analog reference signal and one of the analog input signals.

5. The AD converter according to claim 1,
   wherein the sample-and-hold unit includes three or more sample-and-hold circuits, and
   wherein the analog reference signal is sampled into a different sample-and-hold circuit each time sampling.

6. The AD converter according to claim 5, further comprising an input selector,
   wherein the input selector includes a plurality of selection circuits, each being provided for a corresponding one of the analog input terminals, and
   wherein each of the selection circuits selects the analog reference signal or the analog input signal inputted to the corresponding one of the analog input terminals.

7. A semiconductor device comprising:
   the AD converter according to claim 1;
   an interrupt controller; and
   a central processing unit (CPU),
   wherein the interrupt controller receives a failure notification signal generated by the failure diagnostic unit and generates an interrupt signal based on the failure notification signal, and
   wherein the central processing unit performs an interrupt operation based on the interrupt signal.

* * * * *